United States Patent [19]

Gonzalez

[11] Patent Number: 4,864,464
[45] Date of Patent: Sep. 5, 1989

[54] LOW-PROFILE, FOLDED-PLATE DRAM-CELL CAPACITOR FABRICATED WITH TWO MASK STEPS

[75] Inventor: Fernando Gonzalez, Boise, Id.

[73] Assignee: Micron Technology, Inc., Boise, Id.

[21] Appl. No.: 295,065

[22] Filed: Jan. 9, 1989

[51] Int. Cl.$^4$ .............................................. H01L 29/78
[52] U.S. Cl. ...................................... 361/311; 357/51
[58] Field of Search .................. 357/51; 361/311, 313; 29/25, 42, 557 C

[56] References Cited

U.S. PATENT DOCUMENTS 4,460,911 7/1984 Salters ................................ 357/51 X
4,571,816 2/1986 Dingwall ............................ 357/51 X

FOREIGN PATENT DOCUMENTS 141263 8/1984 Japan ...................................... 357/51
73367 4/1986 Japan ...................................... 357/51

Primary Examiner—Donald A. Griffin
Attorney, Agent, or Firm—Angus C. Fox; Stan Protigal; Jon Busack

[57] ABSTRACT

A low-profile, folded-plate, dynamic random access memory (DRAM) cell capacitor which can be fabicated with only two photoresist masks using equipment and processes identical to those used for the fabrication of DRAM cells having planar capacitors. The n+ silicon substrate, which is an extension of the cell's field-effect transistor drain, functions as the lower half of the capacitor's storage-node plate. The capacitor's field plate is comprised of a doped polycrystalline silicon-2 (poly-2) layer. The field plate is insulated on its lower surface from the n+ silicon substrate by a first dielectric layer of silicon nitride; it is insulated on its edges with a silicon oxide dielectric and on its upper surface with a second dielectric layer of silicon nitride from the upper half of the storage-node plate, which is comprised of a sandwich of n-type poly-3 and poly-4 layers. The upper half of the storage-node plate is tied to the n+ silicon substrate with a buried contact which is an extension of the poly-4-layer. The folded-plate capacitor, compared with a planar capacitor occupying comparable cell surface area, has essentially double the capacitance and greater resistance to alpha-particle-generated soft errors.

20 Claims, 8 Drawing Sheets

LOW-PROFILE, FOLDED-PLATE DRAM-CELL CAPACITOR FABRICATED WITH TWO MASK STEPS

FIELD OF THE INVENTION

This invention is related to semiconductor devices. More specifically, it is related to the design of capacitors used within dynamic random access memory (DRAM) cells. The primary function of the invention is to double the capacitance of a planer DRAM-cell capacitor, without adding more than one additional mask step to the fabrication process, without increasing cell size, and without resorting to unperfected trench processing which requires the implementation of new manufacturing processes and the acquisition of new manufacturing equipment.

BACKGROUND OF THE INVENTION

The memory cells of dynamic random access memories are comprised of two main components: a field-effect transistor and a capacitor. In DRAM cells utilizing a conventional planar capacitor (such as the one depicted in FIG. 1), far more chip surface area is dedicated to planar capacitor 11 than to field-effect transistor (FET) 12. Capacitor 11 has a lower plate formed from the n+ silicon substrate extension 13 of drain 14 of FET 12. Upper capacitor plate 15 is formed from a layer of n-type polycrystalline silicon. Substrate extension 13 is electrically insulated from upper plate 15 by an insulating layer 16. Planar capacitors have generally proven adequate for use in DRAM chips up to the one-megabit level. However, planar capacitors constructed with conventional dielectric materials appear to be unusable beyond the one-megabit DRAM level. As component density in memory chips has increased, the shrinkage of cell capacitor size has resulted in a number of problems. Firstly, the alpha-particle component of normal background radiation will generate electron-hole pairs in the n+ silicon substrate plate of a cell capacitor. This phenomena will cause the charge within the affected cell capacitor to rapidly dissipate, resulting in a "soft" error. Secondly, the sense-amp differential signal is reduced. This aggravates noise sensitivity and makes it more difficult to design a sense-amp having appropriate signal selectivity. Thirdly, as cell capacitor size is decreased, the cell refresh time must generally be shortened, thus requiring more frequent interruptions for refresh overhead. The difficult goal of a DRAM designer is therefore to increase or, at least, maintain cell capacitance as cell size shrinks, without resorting to processes that reduce product yield or that markedly increase the number of masking and deposition steps in the production process.

Several methods for providing adequate cell capacitance in the face of shrinking cell size are either in use or under investigation. Basically, the efforts fall into two categories. Efforts within the first category are aimed at creating complex three-dimensional capacitors; those within the second are aimed at improving the dielectric of the planar capacitor.

The three-dimensional technique currently receiving the most attention involves the creation of "trench" capacitors in the cell substrate. FIG. 2 depicts a DRAM cell having a typical trench capacitor 17. Similar in concept to planar capacitor 11 of FIG. 1, the trench is employed to provide greater plate area, and hence, greater capacitance. The lower plate 18 is still formed from n+ silicon substrate, while the upper plate 19 is formed from a layer of n-type polycrystalline silicon. Lower plate 18 and upper plate 19 are electrically insulated with a dielectric layer 20. DRAM chips employing trench capacitors have been built by a number of European, Japanese and U.S. companies, including Texas Instruments Inc., Nippon Electric Company, Toshiba, Matsuchita and Mitsubishi Electric Corporation. There are several problems inherent in the trench design, not the least of which is trench-to-trench capacitive charge leakage which is the result of a parasitic transistor effect between trenches. Another problem is the difficulty of completely cleaning the capacitor trenches during the fabrication process; failure to completely clean a trench will generally result in a defective cell.

Another three-dimensional technique, which is being used by Mitsubishi Electric Company, Hitachi, and Fujitsu Ltd., is the stacking of capacitor plates between dielectric layers on the DRAM cell surface. FIG. 3 is a graphic represenation of a typical DRAM cell having a stacked capacitor 21. Both the lower plate 22 and the upper plate 23 are made from n-type polycrystalline silicon layers and are separated by a dielectric layer 24. Lower plate 22 and upper plate 23 are both stacked on top of FET 12 and interconnect word line 25, resulting in a high-profile cell which requires more stringent process control for the connection of bit line 26 to FET source 27. The capacitor thus formed also fails to use the n+ silicon substrate extension 13 of FET drain 14 as a plate of capacitor 21. In this design, lower plate 22 is merely tied to substrate extension 13.

Alternatively, other schemes involve the use of ferroelectric materials for DRAM cell capacitor dielectrics. Since ferroelectric materials have a dielectric constant more than 100 times that of silicon oxides, the use of such materials has the potential for allowing the size of the DRAM-cell capacitor to be shrunk to one of the smaller cell elements without resorting to three-dimensional structures. Critics of ferroelectric materials point out that such materials suffer from a "wearout" mechanism. In addition, they warn that there are many chemical incompatibilities with the other materials used in integrated circuit fabrication and that the layering of ferroelectric films within integrated circuit structures has not yet been done successfully.

SUMMARY OF INVENTION

The objectives of the present invention are to create—increasing by no more than one the number of masking steps used for the fabrication of a DRAM cell having a conventional planar capacitor—a DRAM-cell having a low-profile capacitor which, compared with a planar capacitor occupying comparable cell surface area, has essentially double the capacitance and greater resistance to alpha-particle-generated soft errors.

The new DRAM-cell capacitor that comprises the present invention utilizes a folded-plate configuration. The n+ silicon substrate, which is an extension of the cell's field-effect transistor drain, functions as essentially half of the capacitor's storage-node plate (for the sake of convenience, this portion of the storage-node plate shall be referred to as the lower partial plate). The other capacitor plate (referred to hereinafter as the field plate) is comprised of a doped polysilicon-2 layer, which is insulated on its lower surface from the lower partial plate by a first dielectric layer of silicon nitride.

The field plate is insulated on its edges with a silicon oxide dielectric and on its upper surface with a second dielectric layer of silicon nitride from the upper partial plate, which is comprised of an n-type polysilicon-3 layer. The upper partial plate is tied to the lower partial plate with a polysilicon-4 layer having a buried contact. Since the opposing plate is sandwiched between the upper and lower partial plates (the two components of the storage-node plate), the capacitor has a folded configuration.

BRIEF DESCRIPTION OF THE DRAWINGS

Each of the drawing Figures depicts a cross-sectional view of a DRAM cell. FIGS. 1 through 3 depict existing technologies, while

FIG. 1 is a cell having a conventional planar capacitor;

FIG. 2 is a cell having a typical trench capacitor;

FIG. 3 is a cell having a typical stacked capacitor;

FIG. 4 depicts a cell following a first precleaning, but prior to the deposition of a polysilicon-2 layer;

FIG. 5 depicts the cell of FIG. 4 following deposition of a silicon nitride-1 layer and a polycrystalline silicon-2 (poly-2) layer, doping of the poly-2 layer with phosphorus, deposition of a silicon nitride-2 layer, and deposition of an undoped poly-3 layer, and masking with a first photoresist mask;

FIG. 6 depicts the cell of FIG. 5 following a wet poly-3 etch, an oxide etch, and a Lam etch;

FIG. 7 depicts the cell of FIG. 6 following a wet poly-2 etch, removal of the first photoresist mask, and a second precleaning;

FIG. 8 depicts the cell of FIG. 7 following a wet oxidation process;

FIG. 9 depicts the cell of FIG. 8 following a dry, oxide spacer etch;

FIG. 10 depicts the cell of FIG. 9 following a wet oxide dip;

FIG. 11 depicts the cell of FIG. 10, following a wet nitride etch;

FIG. 12 depicts the cell of FIG. 11, following a further oxide etch;

FIG. 13 depicts the cell of FIG. 12, following the deposition of a polycrystalline silicon-4 (poly-4) layer, doping of the poly-3 and poly-4 layers and masking with a second photoresist mask;

FIG. 14 depicts the cell of FIG. 13, following a poly-4 layer etch and removal of the second photoresist mask;

FIG. 15 depicts the cell of FIG. 14 following completion by the deposition of a boro-phosphoro-silicate glass (BPSG) isolation layer and a metallic bit line layer.

DETAILED DESCRIPTION OF THE PREFERRED EMBODIMENT

Up to the point where capacitor construction begins, the process of fabricating a DRAM cell having a low-profile, folded-plate capacitor follows the same steps utilized in the fabrication of DRAM cells having planar capacitors.

Figure 1:
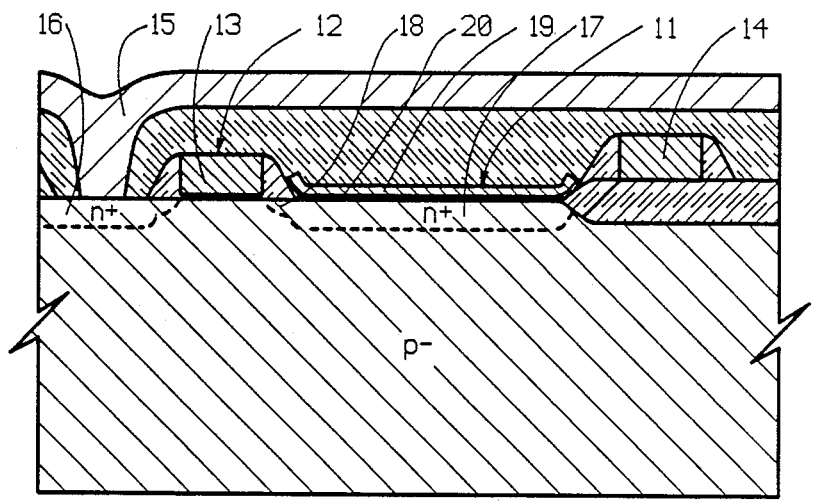
Figure 2:
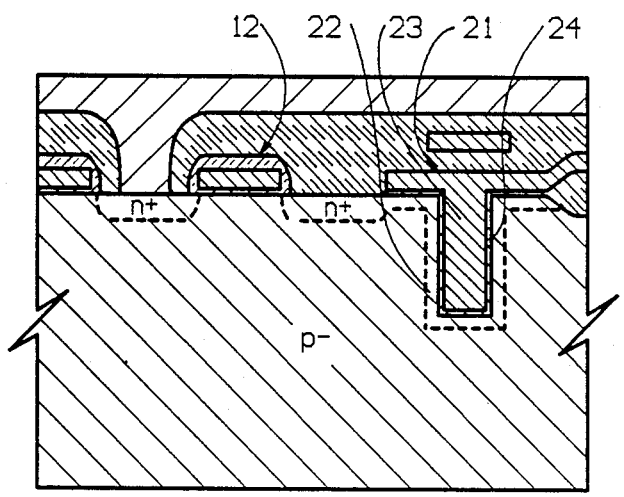
Figure 3:
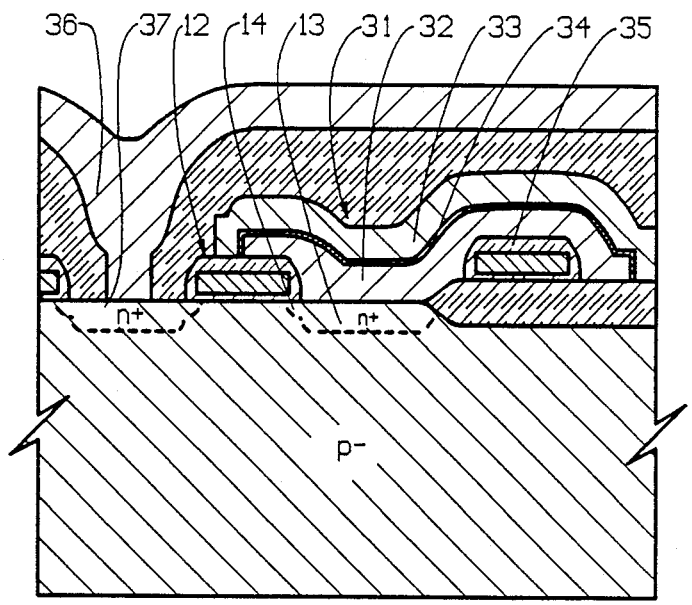
Figure 4:
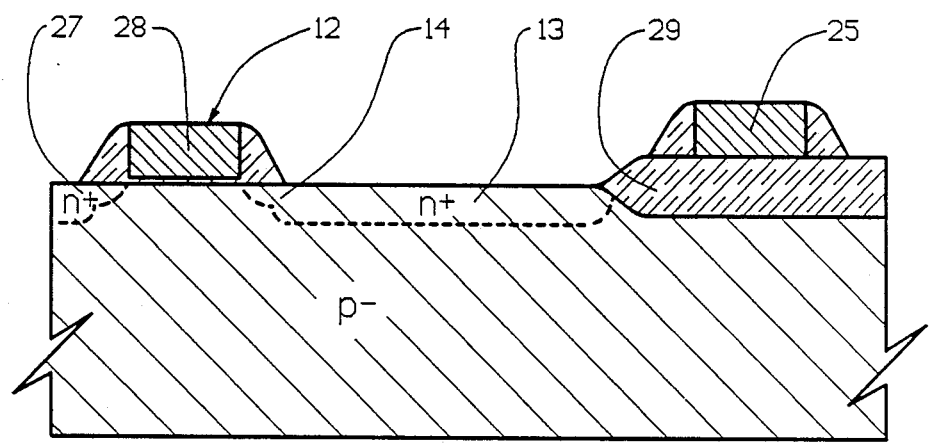
FIGS. 4 through 15 depict the construction of a DRAM cell having a capacitor design conforming to the present invention.

Referring now to FIG. 4, the cell's field effect transistor (FET) 12 has already been created, with word line gate 28 and interconnect word line 25 formed from a polycrystalline silicon-1 layer, and having a source 27 and a drain 14 formed from an n+ silicon substrate. The n+ silicon substrate extension 13 of drain 14 lies in the cell region between FET 12 and field oxide layer 29.

Figure 5:
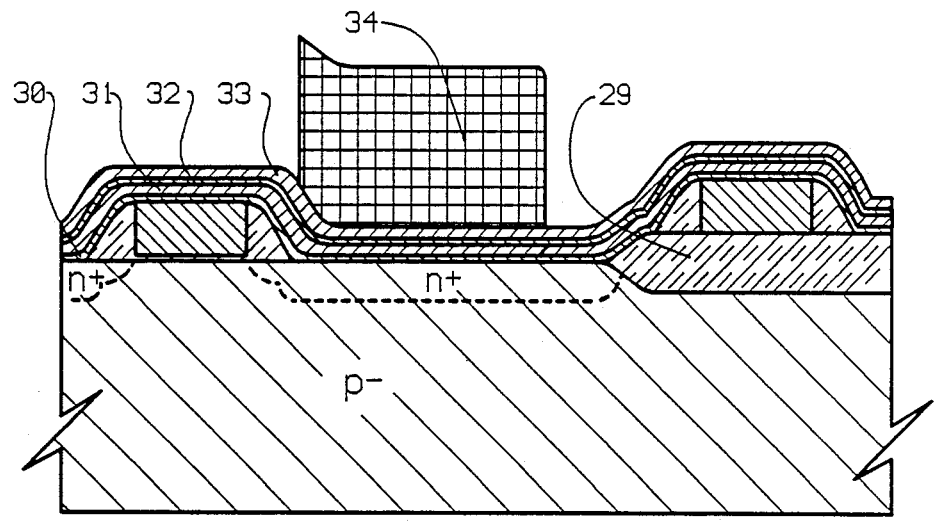

Referring now to FIG. 5, a first silicon nitride dielectric (nitride-1) layer 30, approximately 100 angstroms in thickness, is then deposited over the surface of the entire cell. The nitride-1 surface is then subjected to an oxidation annealing process in order to render innocuous any tiny perforations in the nitride dielectric layer. A polycrystalline silicon-2 ("polysilicon-2" or "poly-2") layer 31, approximately 4,000 angstroms in thickness is then deposited over the entire surface of the cell. The poly-2 layer is then doped to render it conductive. Doping of polysilicon can be accomplished by either ion implantation or diffusion. However, the preferred embodiment of the invention has been created using ion implantation for the doping of polysilicon. Next, a second silicon nitride dielectric (nitride-2) layer 32, approximately 100 angstroms in thickness, is deposited over the entire surface of the cell. Then, a polycrystalline silicon-3 ("polysilicon-3" or "poly-3") layer 33, approximately 1,500 angstroms in thickness, is deposited over the entire surface of the cell. The cell is then masked with first photoresist pattern 34 in the cell region between FET 12 and field oxide layer 29.

Figure 6:
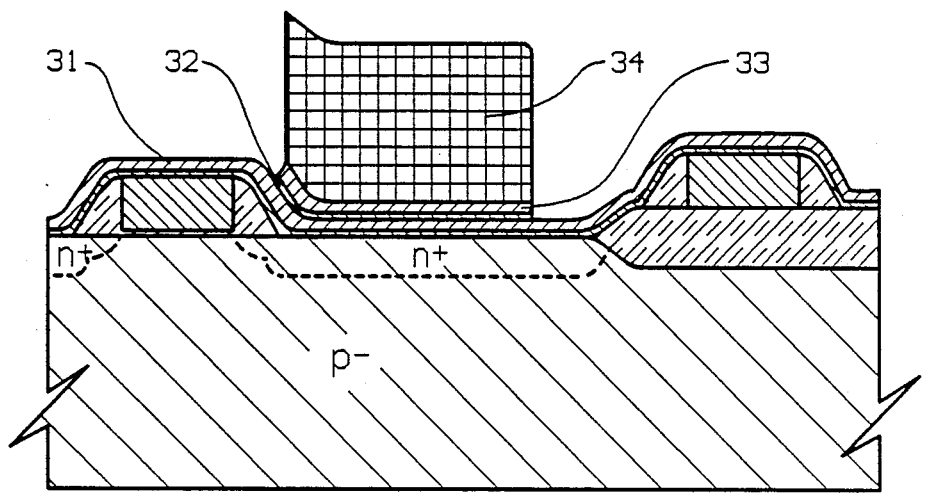

Referring now to FIG. 6, the cell is subjected, first to a wet polysilicon etch which removes the unmasked portion of poly-3 layer 33, then to an oxide etch which removes surface oxide on the unmasked nitride-2 layer 32, then to an anisotropic etch which removes the unmasked nitride-2 layer 32 and approximately one-half of the poly-2 layer 31 below the unmasked nitride-2 layer 32.

Figure 7:
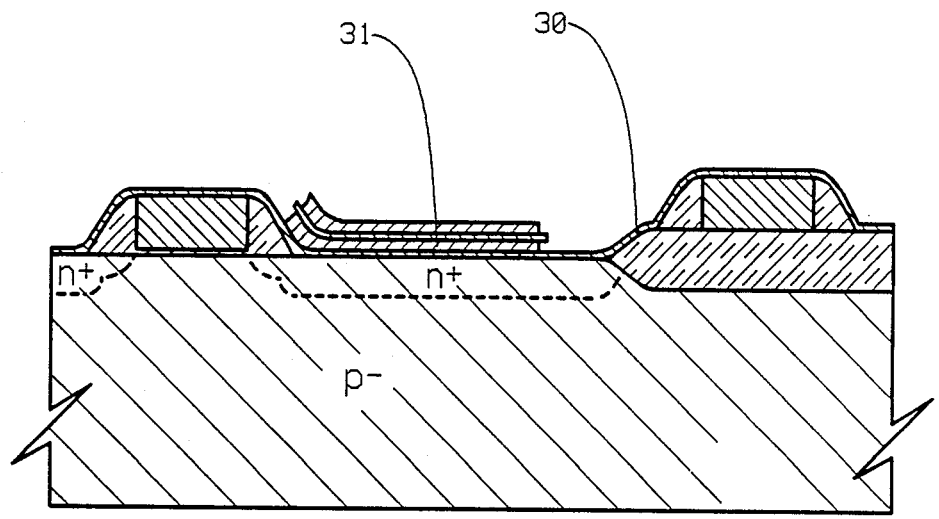

Referring now to FIG. 7, a wet poly etch is employed to remove the remaining half of the exposed poly-2 layer 31. The wet poly etch is used to prevent etching of the nitride-1 layer 30 beneath the etched poly-2 layer 31. Following removal of first photoresist pattern 34 from the cell surface, the cell receives an optional cleaning, first in a hydrogen peroxide-sulfuric acid bath, then in a hydrofluoric acid, oxide etch bath.

Figure 8:
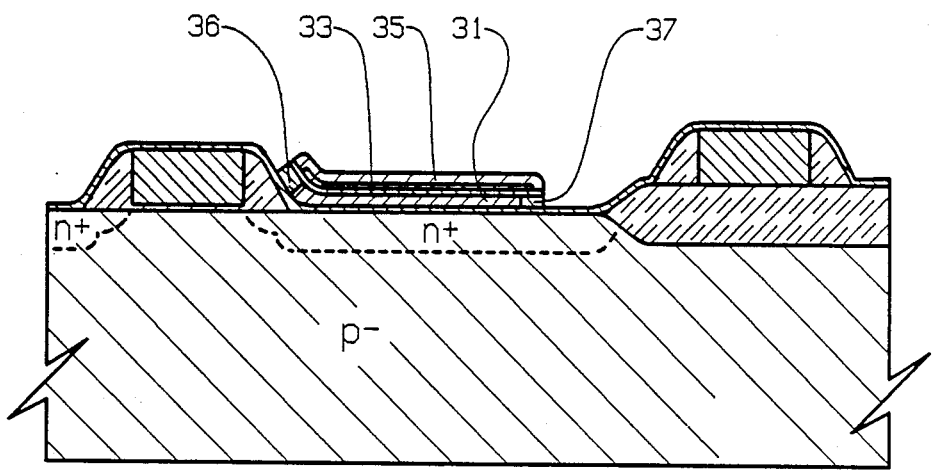

Referring now to FIG. 8, the cell is subjected to a wet oxidation process, which partially oxidizes an upper portion 35 of poly-3 layer 33 and also oxidizes the exposed edges of poly-2 layer 31 to a depth of approximately 2,000 angstroms, creating dielectric borders 36 and 37.

Figure 9:
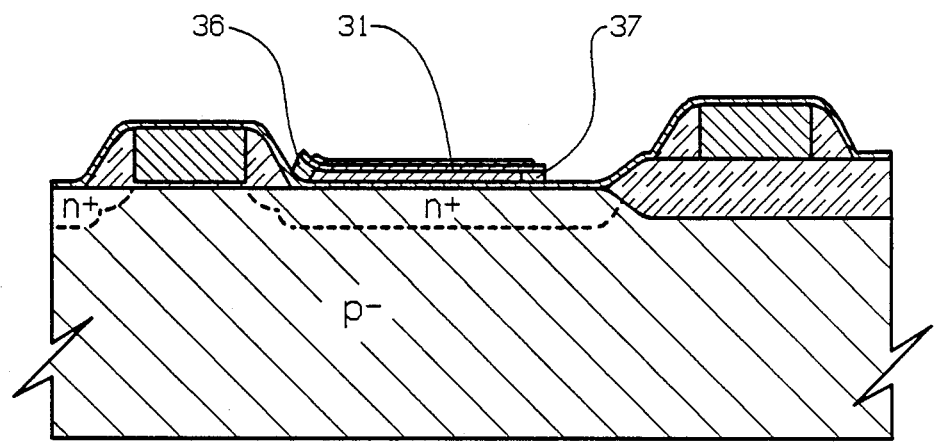

Referring now to FIG. 9, an anisotropic dry oxide etch removes the oxided upper portion 34 of poly-3 layer 33, but does not remove material from borders 36 and 37.

Figure 10:
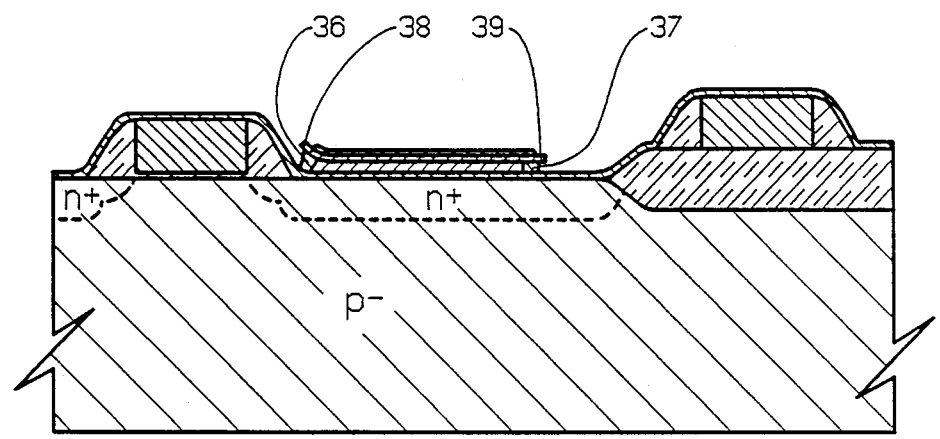

Referring now to FIG. 10, dielectric borders 36 and 37 each lose approximately 500 angstroms of thickness after the cell has been exposed to a wet oxide dip. This wet oxide dip and the anisotropic dry oxide etch referred to in the preceding paragraph have created exposed protrusions 38 and 39 of the nitride-2 layer.

Figure 11:
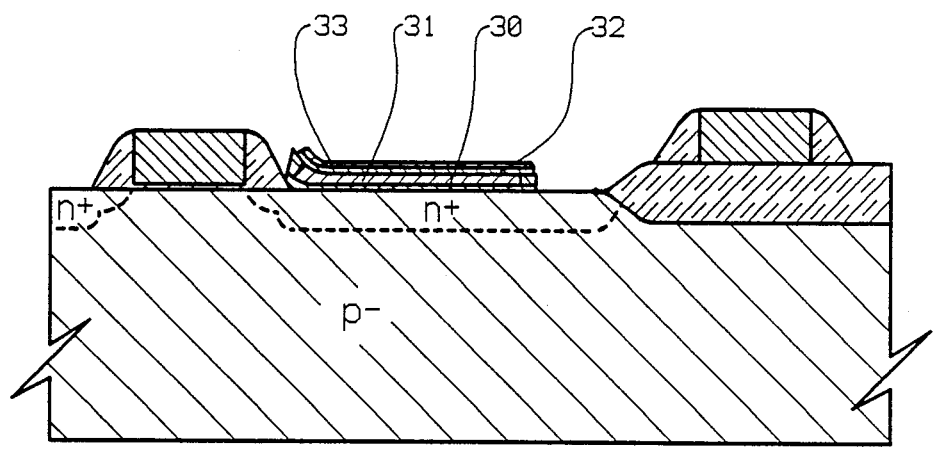

Referring now to FIG. 11, the exposed portions of the nitride-1 layer 30 have been removed by a wet nitride etch. The wet nitride etch has also removed the exposed protrusions 38 and 39 of the nitride-2 layer. However, the remainder of the nitride-2 layer 32, which covers the upper surface of poly-2 layer 31, is protected during the wet nitride etch by the remnant of poly-3 layer 33. Following the wet nitride etch, the cell receives another optional cleaning, first in a hydrogen peroxide-sulfuric acid bath, then in a hydrofluoric acid, oxide etch bath.

Figure 12:
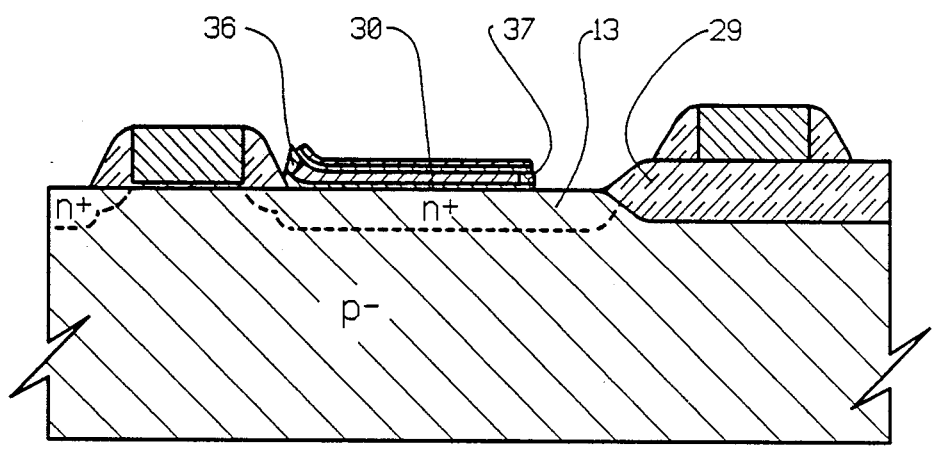

Referring now to FIG. 12, an additional wet oxide etch causes borders 36 and 37 to each lose another 500 angstroms of thickness, leaving borders 36 and 37 with a final thickness of approximately 1,000 angstroms. The wet oxide etch also removes any oxide accumulated on the n+ silicon substrate extension 13 between the remaining portion of nitride-1 layer 30 and field oxide layer 29.

Figure 13:
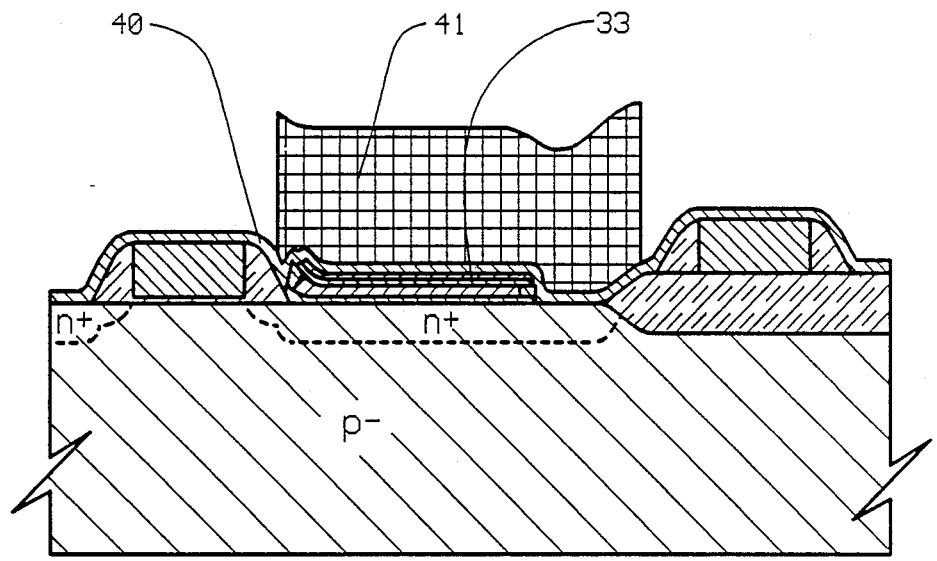

Referring now to FIG. 13, a poly-4 layer 40 approximately 1,000 angstroms in thickness is then deposited over the entire cell surface. The poly-3 layer 33 and the poly-4 layer 40 (the pair of layers are in intimate contact) are simultaneously doped with arsenic to render them conductive. The next step is the creation of a second photoresist mask 41 on top of the poly-4 layer 40.

Figure 14:
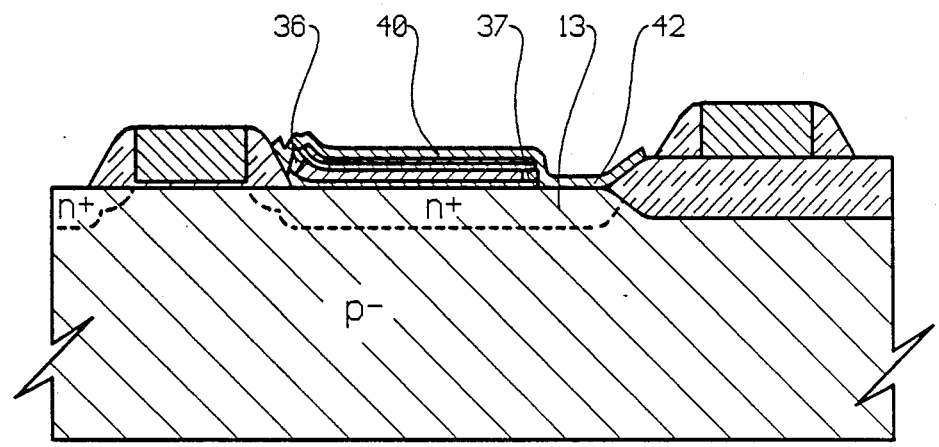

Referring now to FIG. 14, following a wet poly etch of poly-4 layer 40 and removal of second photoresist mask 41, the capacitor is fully formed, with the n+ substrate extension 13 of drain 14 of FET 12 functioning as the lower partial plate of the capacitor's storage-node plate. This lower partial plate is insulated from the capacitor's field plate, which is formed from poly-2 layer 31, by nitride-1 layer 30. The upper partial plate of the capacitor's storage-node plate is formed from poly-3 layer 33. The lower partial plate (n+ substrate extension 13) and the upper partial plate (poly-3 layer 33) are tied together by poly-4 layer 40 which contacts the entire upper surface area of poly-3 layer 33 and contacts n+ substrate extension 13 with buried contact 42. The field plate (poly-2 layer 31) is insulated from the upper partial plate (poly-3 layer 33) by nitride-2 layer 32 and from interconnecting poly-4 layer 40 by dielectric borders 36 and 37. Electrical charge on the capacitor is stored between the field plate and the interconnected pair of partial storage-node plates.

Figure 15:
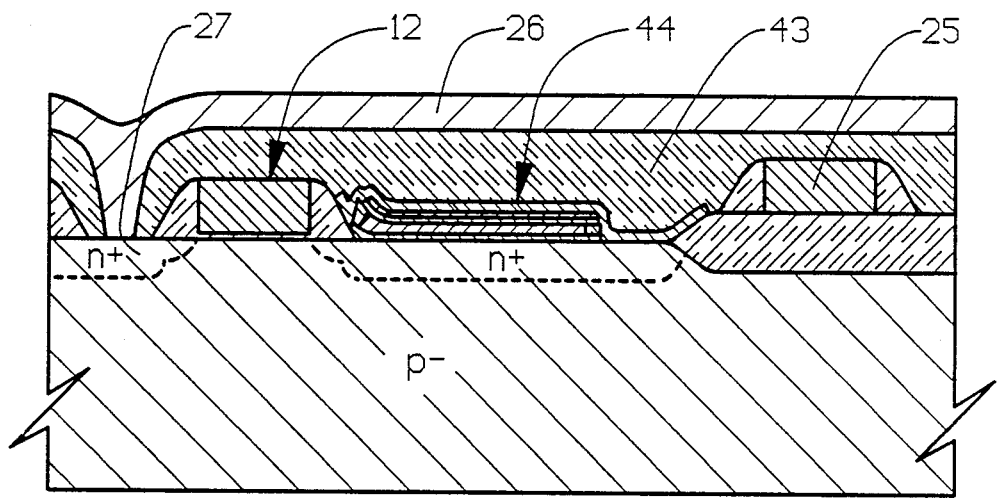

A completed DRAM cell having a folded-plate capacitor fabricated in accordance with this invention is depicted in FIG. 15. A boro-phosphoro-silicate glass (BPSG) isolation layer 43 is shown deposited over FET 12, completed capacitor 44, and interconnect word line 25. Metallic bit line 26 is shown deposited on top of isolation layer 43 and connecting with source 27 of FET 12.

The invention as described herein represents only the preferred embodiment of the device. Other equivalent embodiments are covered within the scope and spirit of the following claims.

I claim:

1. A low-profile, folded-plate, DRAM-cell capacitor comprising:
    an n+ silicon substrate having an upper surface;
    a first dielectric layer deposited on a portion of the upper surface of said silicon substrate;
    a first polycrystalline silicon layer deposited on top of said first dielectric layer;
        said first polysilicon layer having essentially vertical edges;
        said first polysilicon layer insulated at all points on its lower surface from said n+ silicon substrate by said first dielectric layer; and
        said first polycrystalline silicon layer being rendered conductive by doping;
    at least one dielectric border of essentially rectangular cross-section having a lower edge, an outer edge, an upper edge and an inner edge;
        said lower edge in contact at all points with said first dielectric layer; and
        said inner edge in contact at all points with the essentially vertical edges of said first polycrystalline silicon layer;
    a second dielectric layer having upper and lower surfaces and essentially vertical edges;
        the upper surface of said first polycrystalline silicon layer in contact at all points with the lower surface of said second dielectric layer;
        the upper surface of each dielectric border in contact at all points with the lower surface of said second dielectric layer;
    a second polycrystalline silicon layer; and
    a third polycrystalline silicon layer;
        said second polycrystalline silicon layer rendered conductive through doping;
        said second polycrystalline silicon layer covering the entire upper surface of said second dielectric layer; and
        said third polysilicon layer overlapping said second polycrystalline silicon layer and tying said second polycrystalline silicon layer to said n+ silicon substrate with a buried contact in a region of said n+ silicon substrate which is not covered by said first dielectric layer.

2. The DRAM-cell capacitor of claim 1, wherein said first and second dielectric layers are formed from silicon nitride.

3. The DRAM-cell capacitor of claim 2, wherein said second polycrystalline silicon layer is used as a mask to protect said second dielectric layer while said first dielectric layer is being etched.

4. The DRAM-cell capacitor of claim 1, wherein said first polycrystalline silicon layer is doped with phosphorus.

5. The DRAM-cell capacitor of claim 1, wherein said second and third polycrystalline silicon layers are doped with arsenic.

6. The DRAM-cell capacitor of claim 1, wherein said dielectric border is formed from silicon oxide.

7. The DRAM-cell capacitor of claim 6, wherein the silicon component of the silicon oxide comprising said at least one dielectric border was derived from conductively-doped polycrystalline silicon that, for a period during the cell fabrication process, was contiguous with the polycrystalline silicon which comprises said first polycrystalline silicon layer.

8. The DRAM-cell capacitor of claim 7, wherein the silicon oxide comprising said at least one dielectric border is formed by subjecting conductively-doped polycrystalline silicon to a wet oxidation process.

9. The DRAM-cell capacitor of claim 1, wherein said first polycrystalline silicon layer and said second dielectric layer are both etched with a single mask step.

10. A low-profile, folded-plate DRAM-cell capacitor, for storing an electrical charge, comprising:
    a field plate;
    a lower partial storage-node plate;
    an upper partial storage-node plate;
    a first dielectric layer;
    a second dielectric layer; and
    a connecting layer;
        said field plate insulated on its lower surface from said lower partial plate by said first dielectric layer, and on its upper surface from said upper partial plate by said second dielectric layer;
        said lower partial plate and said upper partial plate interconnected by said connecting layer; and said electrical charge being stored between said field plate and said partial storage-node plates.

11. The DRAM-cell capacitor of claim 10, wherein said field plate is comprised of a first layer of conductively-doped polysilicon.

12. The DRAM-cell capacitor of claim 10, wherein said lower partial plate is comprised of an n+ silicon substrate.

13. The DRAM-cell capacitor of claim 12, wherein said n+ silicon substrate is an extension of the cell's field-effect transistor.

14. The DRAM-cell capacitor of claim 10, wherein said upper partial plate is comprised of a second layer of conductively-doped polycrystalline silicon.

15. The DRAM-cell capacitor of claim 10, wherein said first and second dielectric layers are comprised of silicon nitride.

16. The DRAM-cell capacitor of claim 10, wherein said connecting layer is comprised of a third layer of conductively-doped polycrystalline silicon.

17. The DRAM-cell capacitor of claim 10, wherein said connecting layer and said field plate are insulated by a dielectric border.

18. The DRAM-cell capacitor of claim 17, wherein said dielectric border comprised silicon oxide.

19. The DRAM-cell capacitor of claim 18, wherein the silicon component of said silicon oxide was derived from the same first polycrystalline silicon layer from which the capacitor's field plate was formed.

20. The DRAM-cell capacitor of claim 10, wherein said connecting layer overlaps at least part of said upper partial plate and contacts said n+ silicon substrate with a buried contact.

* * * * *